United States Patent
Chebi et al.

(10) Patent No.: US 10,037,883 B2
(45) Date of Patent: Jul. 31, 2018

(54) ENHANCED PRODUCTIVITY FOR AN ETCH SYSTEM THROUGH POLYMER MANAGEMENT

(71) Applicant: Applied Materials, Inc., Santa Clara, CA (US)

(72) Inventors: Robert Chebi, San Carlos, CA (US); Alfredo Granados, San Antonio, TX (US); Zhao H. Ceng, Fremont, CA (US); Jianqi Wang, Fremont, CA (US); Rajan Balesan, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/182,970

(22) Filed: Feb. 18, 2014

(65) Prior Publication Data

US 2014/0273520 A1 Sep. 18, 2014

Related U.S. Application Data

(60) Provisional application No. 61/790,620, filed on Mar. 15, 2013.

(51) Int. Cl.
*H01L 21/02* (2006.01)
*H01L 21/67* (2006.01)
*H01J 37/32* (2006.01)

(52) U.S. Cl.
CPC ...... *H01L 21/02118* (2013.01); *H01J 37/321* (2013.01); *H01J 37/32119* (2013.01); *H01J 37/32522* (2013.01); *H01L 21/67109* (2013.01)

(58) Field of Classification Search
None
See application file for complete search history.

(56) References Cited

U.S. PATENT DOCUMENTS

| | | | | |
|---|---|---|---|---|
| 5,362,361 A | * | 11/1994 | Tatsumi | ........................ 216/67 |
| 5,654,230 A | * | 8/1997 | Jintate | .................... C30B 31/16 |
| | | | | 427/583 |
| 6,007,673 A | * | 12/1999 | Kugo et al. | ................ 156/345.1 |
| 6,206,971 B1 | * | 3/2001 | Umotoy et al. | ............. 118/715 |
| 6,383,300 B1 | * | 5/2002 | Saito | .................... C23C 16/345 |
| | | | | 118/715 |

(Continued)

FOREIGN PATENT DOCUMENTS

CN 1542927 A 11/2004
JP H05-275379 A 10/1993

(Continued)

OTHER PUBLICATIONS

Machine-generated English translation of KR 1020050027697.*

(Continued)

*Primary Examiner* — Kimberly Rizkallah
*Assistant Examiner* — Bo Bin Jang
(74) *Attorney, Agent, or Firm* — Patterson + Sheridan, LLP

(57) ABSTRACT

Embodiments described herein generally relate to an apparatus and methods for reducing the deposition of polymers in a semiconductor processing chamber. A heater jacket and heat sources are provided and may be configured to maintain a uniform temperature profile of the processing chamber. A method of maintaining a uniform temperature profile of a dielectric ceiling of the processing chamber is also provided.

13 Claims, 1 Drawing Sheet

(56) References Cited

U.S. PATENT DOCUMENTS

| | | |
|---|---|---|
| 6,444,085 B1 | 9/2002 | Collins et al. |
| 6,623,595 B1 | 9/2003 | Han et al. |
| 2001/0054601 A1* | 12/2001 | Ding .................... 216/68 |
| 2003/0026917 A1 | 2/2003 | Lin et al. |
| 2003/0190870 A1 | 10/2003 | Shih et al. |
| 2006/0051254 A1* | 3/2006 | Seol ............ G05D 23/22 422/109 |
| 2010/0197138 A1 | 8/2010 | Cheshire et al. |
| 2012/0103524 A1 | 5/2012 | Chebi et al. |
| 2012/0152895 A1 | 6/2012 | Chebi et al. |
| 2012/0273133 A1* | 11/2012 | Ohmi et al. ......... 156/345.29 |

FOREIGN PATENT DOCUMENTS

| | | |
|---|---|---|
| JP | 06-306648 A | 11/1994 |
| JP | H08-124866 A | 5/1996 |
| JP | H08-321492 A | 12/1996 |
| KR | 10-2005-0027697 | 3/2005 |
| KR | 10-0472011 B1 | 3/2005 |
| KR | 10-0795662 B1 | 1/2008 |
| TW | 2010-03815 A | 1/2010 |

OTHER PUBLICATIONS

International Search Report and Written Opinion for International Application No. PCT/US2014/010306 dated May 27, 2014.
Office Action and Search Report for Taiwan Application No. 103103624 dated Mar. 22, 2017.
Chinese Search Report in related application CN 2014800134305 dated Mar. 20, 2017.

\* cited by examiner

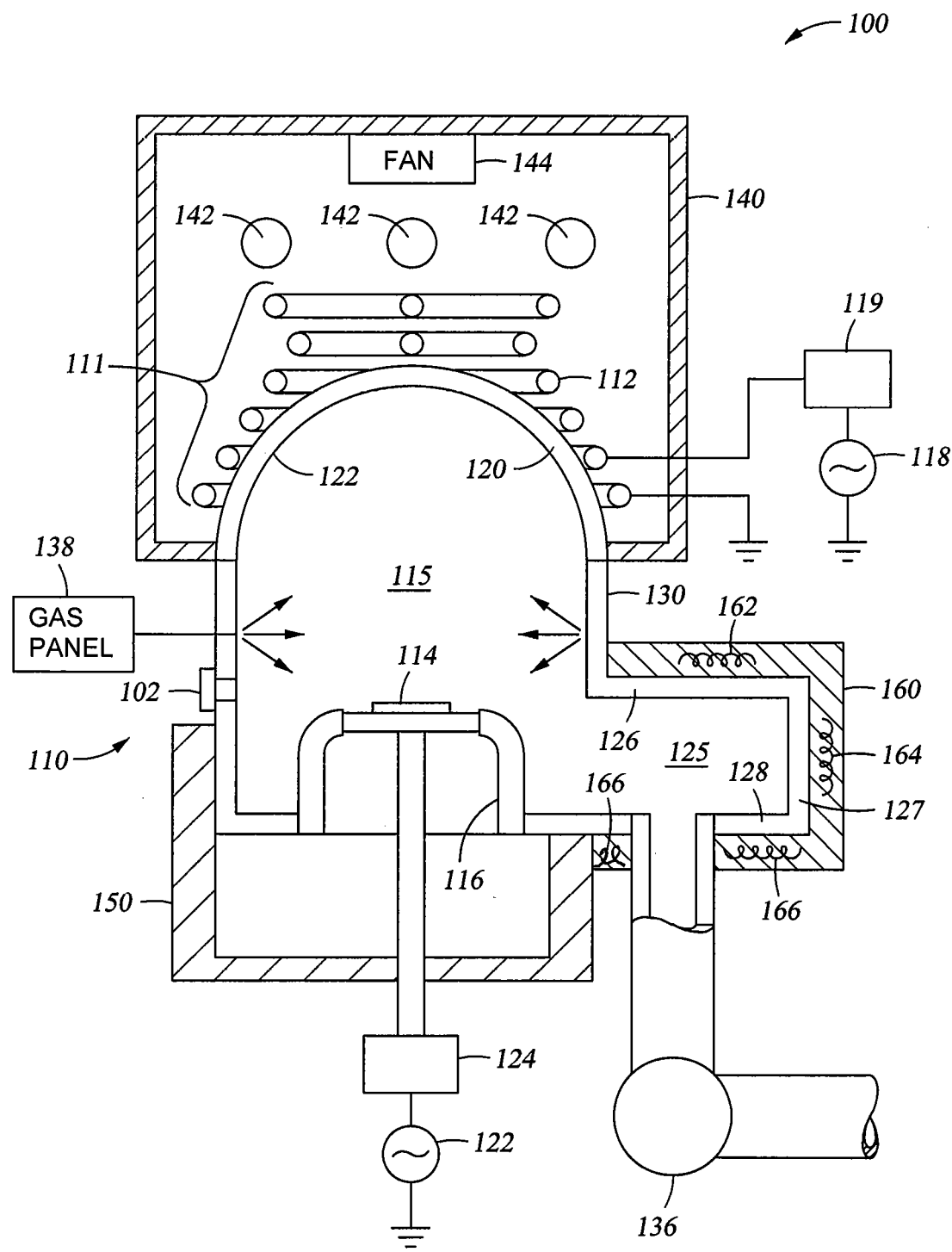

ENHANCED PRODUCTIVITY FOR AN ETCH SYSTEM THROUGH POLYMER MANAGEMENT

CROSS-REFERENCE TO RELATED APPLICATIONS

This application claims benefit of U.S. provisional patent application No. 61/790,620, filed Mar. 15, 2013, which is hereby incorporated by reference.

BACKGROUND OF THE INVENTION

Field of the Invention

Embodiments described herein generally relate to an apparatus and methods for reducing the deposition of polymers in a semiconductor processing chamber. More specifically, embodiments described herein relate to enhanced productivity for an etch system through polymer management.

Description of the Related Art

Plasma chambers may be utilized in certain substrate etching processes. These chambers generally include an RF inductive coil positioned on a backside of a dome or roof of the chamber overlying a substrate being processed. An RF power source may be connected to the coil to couple inductive energy into the chamber to create a plasma source region remote from the substrate being processed.

A recurring problem with chamber walls and dome is that, even in an etching environment, residue may form on the walls and dome resulting from byproducts of the etching process. Such byproducts may be photoresist layers or other materials which are removed from the substrate. The byproducts may be in a gaseous or solid phase and may deposit on the walls of the chamber and the dome. In addition to the byproducts, certain etch chemistries may use polymerizing reactive gases to enhance sidewall protection for certain types of features (i.e. via or trench) being etched on the substrate. The polymerizing reactive gases may also deposit on the internal surfaces, such as the walls or dome, in the vicinity of the plasma.

The residue adhering to the chamber walls and dome may flake off and fall into a processing area of the chamber. Any such particle that falls onto the substrate is likely to produce a failure or reliability problem in the integrated circuit being fabricated on the substrate. If a ceramic dome is used, which acts as a dielectric window for coil antennas, the particle problem may be exacerbated. A source coil is intended to couple large amounts of energy into the chamber and hence, is often operated at high power levels. Inevitably, a substantial fraction of RF energy is thermally dissipated in the dome.

However, the coil is only intermittently operated as substrates are cycled into and out of the chamber, and a ceramic is generally a poor thermal conductor. As a result, the dome material is subjected to repeated and significant temperature swings, resulting in repetitive cycles of thermal expansion and contraction of the dome. The thermal effects are largest in the areas immediately adjacent to the coil. Under these conditions, the residue is more likely to flake and produce particles.

As previously described, residue on the walls or dome during etching is generally undesirable. The residue can be disruptive to system performance and the resulting on-substrate results. One method to manage the residue is to periodically replace the dome. However, this method is very expensive and time consuming. Another method of managing the residue is to clean the chamber interior. However, this method imposes significant system downtime and requires manual involvement of technicians.

Accordingly, what is needed in the art is an apparatus and method for reducing or controlling polymer deposition in a substrate processing chamber in a timely and cost efficient manner that decreases processing chamber downtime.

SUMMARY OF THE INVENTION

Embodiments described herein generally relate to an apparatus and methods for reducing the deposition of polymers in a semiconductor processing chamber. More specifically, embodiments described herein relate to enhanced productivity for an etch system through polymer management.

In one embodiment, an apparatus for processing a substrate is provided. The apparatus comprises a dielectric ceiling having a roughened surface, a conductive body disposed within an insulator, a substrate support, and a pump port disposed within a heater jacket. The heater jacket comprises a plurality of heating elements disposed therein configured to maintain a uniform temperature profile of the pump port. A plurality of heat sources configured to maintain a uniform temperature profile of the dielectric ceiling is also provided.

In another embodiment, a method of controlling polymer deposition is provided. The method comprises forming a plasma in a processing chamber by providing power to one or more RF coils, providing power to a plurality of heat sources when substantially no power is provided to the RF coils, and configuring the heat sources to maintain a constant temperature of a dielectric ceiling by alternating power to the RF coils and the heat sources.

In yet another embodiment, a heater jacket is provided. The heater jacket comprises a jacket body disposed around a pump port, a first heating element disposed adjacent a first region of the pump port, a second heating element disposed adjacent a second region of the pump port, and a third heating element disposed adjacent a third region of the pump port.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 is a schematic side view of an etch reactor.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described here may be beneficial to any plasma assisted substrate processes, such as etch, deposition, or the like. Non-limiting examples of suitable processes include deep silicon (Si) etch processes used in forming microelectromechanical systems (MEMS) devices or thru silicon via (TSV) applications.

FIG. 1 is a schematic side view of an etch reactor 100. The etch reactor 100 may be utilized alone or, more typically, as a processing module of an integrated semiconductor substrate processing system, or cluster tool, such as a CENTURA® integrated semiconductor substrate processing system, available from Applied Materials, Inc., of Santa Clara, Calif. Examples of suitable etch reactors that may be modified in accordance with the embodiments described herein include the ADVANTEDGE™ line of etch reactors (such as the AdvantEdge S or AdvantEdge H), the DPS® line of etch reactors (such as DPS®, DPS® II, DPS® AE, DPS® HT, DPS® G3 poly etcher, DPS®+, DPS® DT+DPS® DTM), or other etch reactors, also available from Applied Material, Inc., Santa Clara, Calif. Other etch reactors or non-etch plasma processing equipment, including those available from other manufacturers, such as processing equipment used for deposition, surface treatment, or the like, may also be modified in accordance with the teachings provided herein.

The etch reactor 100 comprises a process chamber 110 having a processing volume 115 with a substrate support 116 disposed therein. A plasma generator may create and or maintain a plasma within the processing volume 115, or that can be delivered to the processing volume 115 during use of the etch reactor 100. In certain embodiments, the chamber 110 may provide a dome-shaped dielectric ceiling (also referred to as a dome or dielectric window) disposed above a conductive body (wall) 130. In certain embodiments, the ceiling 120 may have other geometries, for example, a substantially flat geometry. The processing volume 115 may be enclosed within the conductive body 130 and the dielectric ceiling 120.

The dielectric ceiling 120 may comprise a ceramic material, such as quartz or alumina. In one embodiment, a roughened surface 122 of the dielectric ceiling 120 may be roughened. The dielectric ceiling 120 may be bead blasted or roughened by another suitable method to provide a predetermined surface roughness. In one embodiment, the surface roughness (measured in μin) may be in a range from about 20 $R_a$ to about 120 $R_a$. The predetermined surface roughness may vary depending on particular processing conditions to which a part is exposed (for example, semiconductor processing conditions such as, without limitation, a type and thickness of material deposited thereon). The roughened surface 122 may provide a greater surface area to which the deposited material may adhere and accumulate. Additionally, the roughened surface 122 may provide better adhesion between the dielectric ceiling 120 and the deposited material, and make the deposited material more resistant to flaking.

A pump port 125 may be disposed asymmetrically with respect to the processing volume 115 to remove one or more gases from the processing volume 115. In one embodiment, the pump port 125 may be disposed to one side of the processing volume 115, such that, during use, asymmetric regions of high and low pressure form within the processing volume 115 causing flow asymmetry. The pressure within the processing volume 115 may be controlled by a throttle valve (not shown) and a vacuum pump 136. In certain embodiments, a slit valve 102 for transferring a substrate 114 into and out of the process chamber 110, and/or the geometry of the process chamber 110 itself may be the cause or may contribute to any flow asymmetry in the process chamber 110.

In certain embodiments, a heater jacket 160 may be provided. The heater jacket 160 may substantially surround the pump port 125 such that the pump port 125 may be disposed within the heater jacket 160. The heater jacket 160 may comprise a plurality of heaters, such as resistive elements, that may be configured to maintain a uniform temperature profile of the pump port 125.

A first heater 162 may be disposed adjacent a first region 126 of the pump port 125. The first region 126 may be a substantially horizontal top portion of the pump port 125 and may be disposed the conductive body 130 and a second region 127. A second heater 164 may be disposed adjacent the second region 127 of the pump port 125. The second region 127 may be a vertical portion disposed between the first region 126 and a third region 128. In certain embodiments, the second region may be substantially annular. A third heater 166 may be disposed adjacent the third region 128 of the pump port 125. The third region 128 may be a substantially horizontal bottom portion that may be disposed between the chamber insulator 150 and the second region 127. In certain embodiments, the plurality of heaters and respective regions may be controlled independently to provide a uniform temperature profile of the pump port 125. In certain embodiments, the plurality of heaters may be configured to maintain the pump port 125 at a temperature of between about 50° C. and about 150° C., such as between about 80° C. and about 130° C.

The plasma generator may be any suitable plasma generator, such as a radio frequency (RF) plasma generator, a remote plasma generator, or the like. In certain embodiments, the plasma generator comprises a signal generator 118 coupled to an electrode. The signal generator 118 generally provides energy at a frequency suitable to form and/or maintain a plasma in the process chamber 110 or remote from the process chamber 110. For example, the signal generator 118 may provide a signal at a frequency of about 50 kHz to about 2.45 GHz. The plasma generator may be configured to provide an asymmetric plasma within the process chamber 110 that may compensate for the asymmetric pressure/flow conditions within the process chamber 110. The signal generator 118 may be coupled to the electrode through a first matching network 119 to minimize the reflected power during use.

In certain embodiments, the electrode may be an antenna 111 comprising at least one RF coil 112. In certain embodiments, the antenna 111 (as shown in FIG. 1) may be disposed above the dielectric ceiling 120 and may be configured to inductively couple RF energy to a process gas provided to the processing volume 115. The processing gas may be provided to the processing volume 115 through an injector (not shown) from a gas panel 138. The antenna 111 may be coupled to the signal generator 118 through the first matching network 119.

The antenna 111 may be disposed above the substrate support 116. The substrate support 116 may be coupled, through a second matching network 124, to a biasing power source 122. The biasing power source 122 may be capable of producing up to about 1500 W of RF energy at a suitable frequency. In certain embodiments, the frequency of the signal provided by the biasing power source 122 may be about 400 kHz to about 13.56 MHz. The biasing power may be either continuous or pulsed power. In certain embodiments, the biasing power source 122 may be a DC or pulsed DC source.

A housing 140 may be disposed above the conductive body 130 of the processing chamber 110. The dielectric ceiling 120 and antenna 111 may be disposed within the housing 140. A plurality of heat sources 142, such as lamps, may be disposed within the housing 140. The heat sources 142 may be disposed above the antenna 111. The heat sources 142 may be configured to heat the dielectric ceiling 120 particularly, for example, when the antenna 111 is not energized. A fan 144 may be disposed above the heat sources 142 within the housing 140 and may be configured to circulate air within the housing 140 to provide an even heat distribution from the heat sources 142 to the dielectric ceiling 120. The fan 144 may also be configured to cool the RF coils 112 of the antenna 111. The heat sources 142 and antenna 111 may be configured to maintain a uniform temperature profile of the dielectric ceiling 120. In certain embodiments, the heat sources 142 may be configured to maintain a substantially constant temperature of the dielectric ceiling 120.

In certain embodiments, a chamber insulator 150 may be formed around a portion of the conductive body 130. In certain embodiments, substantially all of the conductive body 130 may be surrounded by the chamber insulator 150. The chamber insulator 150 may be configured to insulate the processing chamber 110 and provide a uniform temperature profile throughout various regions of the processing chamber 110 when the antenna 111 is not energized. The chamber insulator 150 may also comprise a heat exchanger (not shown) disposed within the chamber insulator 150. The heat exchanger may comprise a fluid transport system for transporting a liquid, such as water or ethylene glycol. Maintaining a uniform temperature profile of the conductive body 130 may reduce the deposition of residue on the conductive body 130. In certain embodiments, the heat exchanger and the chamber insulator 150 may maintain the conductive body 130 between a temperature of about 50° C. and about 150° C., such as between about 80° C. and about 90° C.

Although not illustrated in FIG. 1, a controller may be coupled to various elements, such as those described above, to control the various processing parameters performed in the etch reactor 100 during substrate processing. The controller may be one of any form of general purpose computer processors than may be used in an industrial setting for controlling various chamber and sub-processors. The controller may comprise a central processing unit (CPU), a memory, and support circuits for the CPU. The memory, or computer-readable medium, of the CPU may be one or more of readily available memory such as random access memory, read only memory, floppy disk, hard disk, or any other form of digital storage, local or remote. The support circuits are coupled to the CPU for supporting the processor in a conventional manner. These circuits may include a cache, power supplies, clock circuits, input/output circuitry, and subsystems, and the like. Method of operation may be stored in the memory as a software routine. The software routine may also be stored and/or executed by a second CPU that is remotely located from the hardware being controlled by the CPU.

Maintaining the processing chamber 110 at a uniform temperature profile may be advantageous in controlling the deposition of residue, or polymer materials, on the conductive body 130 and dielectric ceiling 120. In one embodiment, the heat sources 142 may be configured to maintain a uniform temperature profile of the dielectric ceiling 120. In operation, the RF coils 112 of the antenna 111 may be cycled "on" and "off" to create a plasma in the processing volume 115. When the RF coils 112 are supplied with power, the coils 112 heat the dielectric ceiling 120. When the RF coils 112 are off, the RF coils 112 do not provide heat energy to the dielectric ceiling 120. If the dielectric ceiling 120 cools, increased amounts of material form on the dielectric ceiling 120, which may subsequently flake off on the substrate 114 being processed because the dielectric ceiling 120 is heated due to the differences in the coefficient of thermal expansion between the dielectric ceiling 120 and the material deposited thereon.

The heat sources 142 may be cycled on and off in a manner that maintains a uniform temperature profile of the dielectric ceiling 120. In one embodiment, when the RF coils 112 are on, the heat sources 142 may be off. In another embodiment, when the RF coils 112 are off, the heat sources 142 may be on. The cycling of the RF coils 112 and the heat sources 142 may provide a uniform heat profile of the dielectric ceiling 120 which may decrease the flaking of the residue from the dielectric ceiling 120. In certain embodiments, the heat sources 142 may be configured to maintain the dielectric ceiling 120 at a temperature of between about 50° C. and about 150° C., such as between about 80° C. and about 130° C.

In another embodiment, the heater jacket 160 and the plurality of heaters may maintain a uniform temperature profile of the pump port 125. Maintaining a uniform temperature profile of the pump port 125 may reduce residue deposition on the regions, 126, 127, and 128 of the pump port 125. In certain embodiments, the first heater 162 may maintain the first region 126 at a first temperature, the second heater 164 may maintain the second region 127 at a second temperature, and the third heater 166 may maintain the third region 128 at a third temperature. In one embodiment, the first, second, and third temperatures may be maintained between about 50° C. and about 150° C., such as between about 80° C. and about 130° C.

Multiple heaters and heating zones may provide for improved temperature control of the pump port 125 due to the different heat fluxes between the various regions of the pump port 125. For example, the third region 128 may experience a greater heat flux due to the movement of gases through the pump port 125. Less gas may flow near the first region 126 and thus, less heat flux may be experienced there. Accordingly, independent control of the various zones may provide for improved temperature uniformity of the pump port. The relative masses of the various regions of the pump port 125 may also affect the temperature uniformity. For example, the first region 126 may have a greater mass than the second region 127 and may require more heat input to maintain the first region 126 at the same temperature as the second region 127. The multiple zone heater jacket 160 compensates for temperature flux due to gas flow and the relative masses of the various regions of the pump port 125 and provides for an improved temperature uniformity of the pump port 125.

While the foregoing is directed to embodiments of the present invention, other and further embodiments of the invention may be devised without departing from the basic scope thereof, and the scope thereof is determined by the claims that follow.

The invention claimed is:

1. An apparatus for processing a substrate, comprising:
a dielectric ceiling having a roughened surface;
a conductive body connected to the dielectric ceiling, the conductive body having a first portion having a first bottom surface disposed within an insulator;
a substrate support disposed in the conductive body, the dielectric ceiling connected with the conductive body defines an interior region above the substrate support and the substrate support is circumscribed by the conductive body;

a pump port coupled to a second portion of the conductive body and in fluid communication with the interior region, the pump port directly coupled to a second bottom surface of the second portion of the conductive body disposed within a heater jacket, the heater jacket having a plurality of heating elements disposed therein operable to maintain the pump port at a temperature of between 80° C. and 130° C., wherein the first bottom surface of the first portion is formed contiguously coplanar with the second bottom surface of the second portion; and a plurality of heat sources configured to maintain a uniform temperature profile of the dielectric ceiling.

2. The apparatus of claim 1, wherein the dielectric ceiling comprises a ceramic material.

3. The apparatus of claim 1, wherein the roughened surface has a surface roughness of between about 20 $R_a$ and about 120 $R_a$.

4. The apparatus of claim 1, wherein the dielectric ceiling is substantially dome shaped.

5. The apparatus of claim 1, wherein the heater jacket comprises three heating elements.

6. The apparatus of claim 5, wherein a first heating element is configured to heat a first region of the pump port.

7. The apparatus of claim 5, wherein a second heating element is configured to heat a second region of the pump port.

8. The apparatus of claim 5, wherein a third heating element is configured to heat a third region of the pump port.

9. The apparatus of claim 1, wherein the plurality of heating elements are configured to maintain a uniform temperature profile of the pump port.

10. The apparatus of claim 1, wherein the heat sources comprise lamps.

11. The apparatus of claim 1, wherein the heat sources maintain the dielectric ceiling at a constant temperature of between about 80° C. and about 130° C.

12. A heater jacket, comprising:

a jacket body disposed around a pump port directly coupled to a first bottom surface of a first portion of a conductive body while a second portion of the conductive body is disposed free from the jacket body, wherein the second portion of the conductive body is configured to circumscribe a substrate when disposed therein, and the second portion is laterally coupled to the first portion and a second bottom surface of the second portion is formed contiguously coplanar with the first bottom surface of the first portion;

a first heating element disposed adjacent a first region of the pump port;

a second heating element disposed adjacent a second region of the pump port; and a third heating element disposed adjacent a third region of the pump port, wherein the first heating element, the second heating element, and the third heating element are operable to maintain the pump port at a temperature of between 80° C. and 130° C.

13. The heater jacket of claim 12, wherein the first heating element is configured to maintain a first temperature, the second heating element is configured to maintain a second temperature, and the third heating element is configured to maintain a third temperature, and wherein the first temperature, the second temperature, and the third temperature are different.

* * * * *